US 6,709,277 B2

(12) United States Patent
Ruttan et al.

(10) Patent No.: US 6,709,277 B2
(45) Date of Patent: Mar. 23, 2004

(54) SYSTEM AND METHOD FOR CONNECTING A POWER CONVERTER TO A LAND GRID ARRAY SOCKET

(75) Inventors: Thomas G. Ruttan, Lake Oswego, OR (US); Ed Stanford, Olympia, WA (US); Peter A. Davison, Puyallup, WA (US); Tony Harrison, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/121,169

(22) Filed: Apr. 12, 2002

(65) Prior Publication Data

US 2002/0164894 A1 Nov. 7, 2002

Related U.S. Application Data

(62) Division of application No. 09/675,259, filed on Sep. 28, 2000.

(51) Int. Cl.[7] ............................................. H01R 12/00
(52) U.S. Cl. .............................. 439/66; 439/71; 439/69
(58) Field of Search ............................. 439/66, 67, 74; 364/825, 697, 619; 257/777, 780, 737, 723; 29/830–840, 854, 860, 739, 874

(56) References Cited

U.S. PATENT DOCUMENTS

| 5,599,193 | A | | 2/1997 | Crotzer | |
|---|---|---|---|---|---|
| 5,864,478 | A | * | 1/1999 | McCutchan et al. | 363/147 |
| 6,018,465 | A | | 1/2000 | Borkar et al. | |
| 6,181,008 | B1 | * | 1/2001 | Avery et al. | 257/723 |
| 6,400,576 | B1 | * | 6/2002 | Davidson | 361/763 |
| 6,469,908 | B2 | * | 10/2002 | Patel et al. | 361/760 |
| 6,522,156 | B2 | * | 2/2003 | Tustaniwskyj et al. | 324/754 |
| 2002/0196614 | A1 | * | 12/2002 | DiBene et al. | 361/803 |

FOREIGN PATENT DOCUMENTS

| EP | 0622847 A2 | 11/1994 |
|---|---|---|
| EP | 0717443 A1 | 6/1996 |
| WO | WO 0028590 | 5/2000 |

OTHER PUBLICATIONS

International Search Report PCT/US 01/30353.

* cited by examiner

Primary Examiner—Jean F. Duverne
(74) Attorney, Agent, or Firm—Blakely, Sokoloff, Taylor & Zafman LLP

(57) ABSTRACT

A land grid array (LGA) socket is connected to a power converter using compression contact technology eliminating the need for an edge-card connector typically required in such applications. The LGA socket is mounted to the power converter in a single direction of assembly (i.e., the vertical axis).

8 Claims, 5 Drawing Sheets

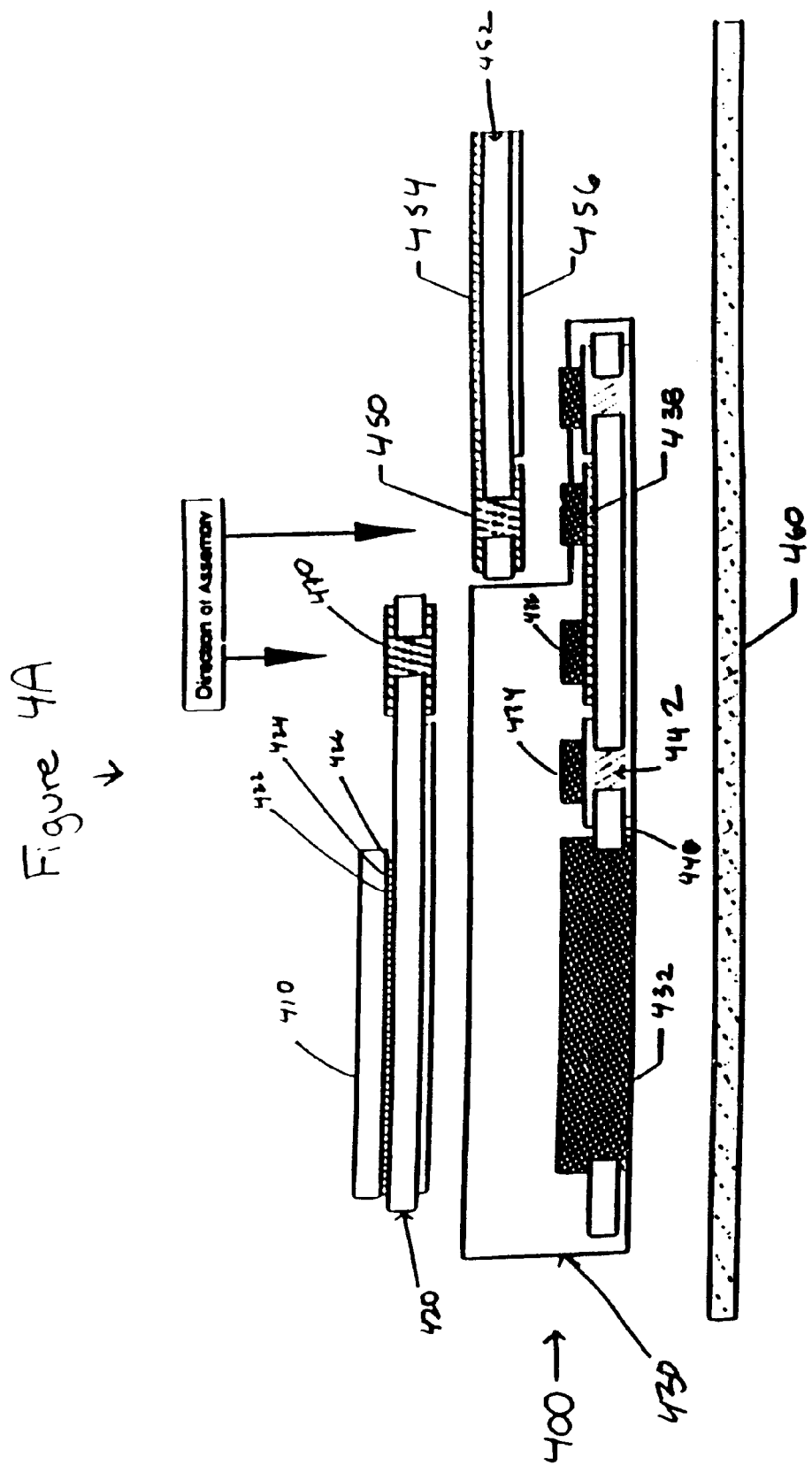

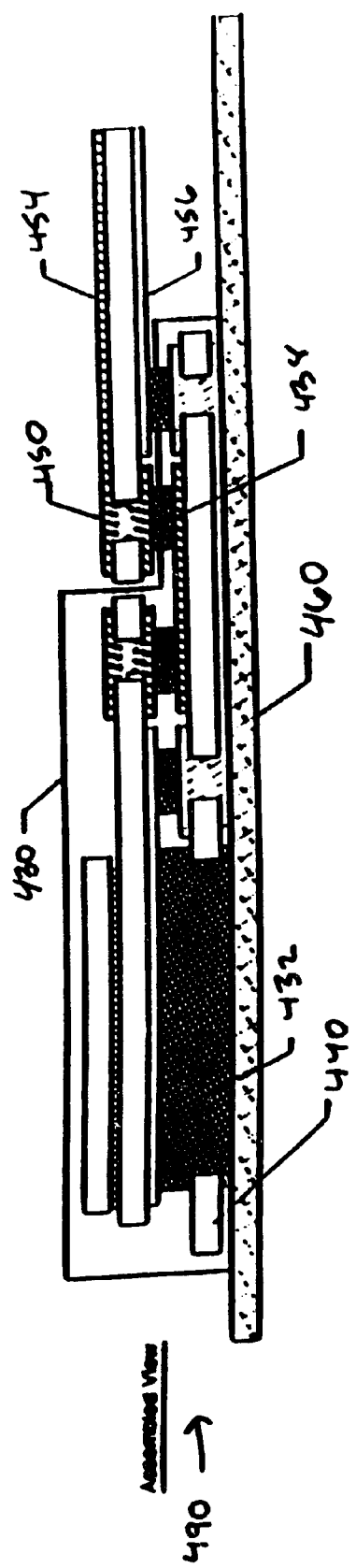

SYSTEM AND METHOD FOR CONNECTING A POWER CONVERTER TO A LAND GRID ARRAY SOCKET

This is a Divisional Application of Ser. No. 09/675,259 filed Sep. 28, 2000, which is presently pending.

FIELD OF THE INVENTION

The present invention relates generally to power delivery for electronic circuits and, more particularly, to an improved power connector for land grid array (LGA) central processing unit (CPU) sockets.

BACKGROUND

A standard computer system typically includes integrated circuit devices mounted to a large printed circuit board known as a motherboard using a socket or similar type of electrical connector. The motherboard is supplied with voltage from a power supply, usually at a higher DC level than is required by the integrated circuit device.

Currently, a voltage regulator (i.e., a DC—DC converter) is used in certain high performance computer systems along with a pin grid array (PGA) socket. The central processing unit (CPU) package that connects to the socket consists of an integrated circuit device (e.g., a silicon chip) soldered to a package substrate using flipchip ball grid array (FCBGA) which, in turn, is soldered to one side of an interposer using ball grid array (BGA) technology. The package substrate connects to the PGA socket using multiple contacts in a matrix arrangement each having a pin type tail. The DC—DC converter connection consists of a multi-layer flex board and an edge-card connector that connects to one edge of the interposer substrate. The present configuration requires the CPU package to be inserted into the PGA socket in the vertical axis (i.e., the Z-axis). The DC—DC converter is then attached in the X-axis sliding direction requiring a complex retention mechanism.

In the recently developed land grid array (LGA) socket an array of pads, rather than pins, provide the requisite electrical connections between the integrated circuit device and the printed circuit board. LGA sockets are advantageous because they do not require soldering between the socket and the CPU package. Moreover, LGA sockets reduce the height of the socket/package/CPU solution (because they do not require the use of long pins) thereby resulting in shorter circuit paths and improved electrical performance. However, in order to connect the current DC—DC converter to an LGA socket, an interposer would be required to provide the edge-card interface required by the DC—DC converter. The interposer would add height, electrical path length, and parasitic inductance to the socket/package/CPU solution, thus negating the advantages of using the LGA socket.

Although multiple one ounce copper power planes may also be used to supply power from the DC—DC converter to the CPU socket through the motherboard, an excessive number of power and ground contacts would be needed and the additional power and ground planes make motherboard routing difficult. Delivering high DC currents through the motherboard to the LGA socket is an expensive solution and has additional technical challenges not associated with delivering current directly onto the LGA socket assembly.

Therefore, it would be advantageous to provide a low inductance and resistance interconnect that improves the current carrying capacity from the DC—DC converter to the LGA socket. It would also be helpful if the interconnect required only a single direction (vertical or Z-axis) of assembly which would save time and manufacturing costs.

BRIEF DESCRIPTION OF THE DRAWINGS

The present invention is illustrated by way of example, and not limitation, in the figures of the accompanying drawings in which like reference numerals refer to similar elements and which:

FIG. 4A is a cross-sectional view of the spatial relationship of the component parts of an unassembled LGA integrated circuit device package and a DC—DC converter according to one embodiment of the present invention.

FIG. 4B is a cross-sectional view of the spatial relationship of the component parts of an assembled LGA integrated circuit device package and a DC—DC converter according to one embodiment of the present invention.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention. Accordingly, the specification and drawings are to be regarded in an illustrative rather than a restrictive sense.

Compression contact technology has been used in the computer industry for a number of years. Various forms of this technology have been developed, including polymer based contacts with electrically conductive metal particles or wires imbedded in the polymer and stamped metal contact springs. For example, there are commercially available sockets, connectors, and interconnect products using this technology. However, compression contact technology has never been employed to connect a voltage regulator (i.e., a DC—DC converter) to a land grid array (LGA) socket.

It would be helpful to use compression contacts (e.g., metal, conductive polymer, or others) to eliminate the edge-card connector typically used in this application, thus reducing the loop inductance and contact resistance of the connection. Furthermore, compression contacts would simplify the retention and mounting mechanism of the LGA socket by providing a means for contacting the LGA socket from a vertical rather than a horizontal direction as is required using conventional edge-card connectors.

The present embodiment provides a power connector consisting of a circuit board connected to one end of a DC—DC converter output circuit board. Since the connector must carry very high current levels from the DC—DC converter to the LGA socket and return (ground), these connections on the circuit board consists of one or more layers each of wide and thick metal, such as four ounce or six ounce copper. The compression contacts may be attached at the other end of the board with sufficient numbers and cross-sectional area to carry the required electrical current.

The board may be mated to the LGA socket with the appropriate contact pattern and the contacts may be compressed with a clamping or retention mechanism. The retention mechanism provides the clamping force as well as the compression stop so that the contacts will be compressed to a predetermined level, but will not continue to compress further. The LGA socket has the required metal conductor layers to carry the electrical current from the power contacts and to the CPU.

Figure 1:
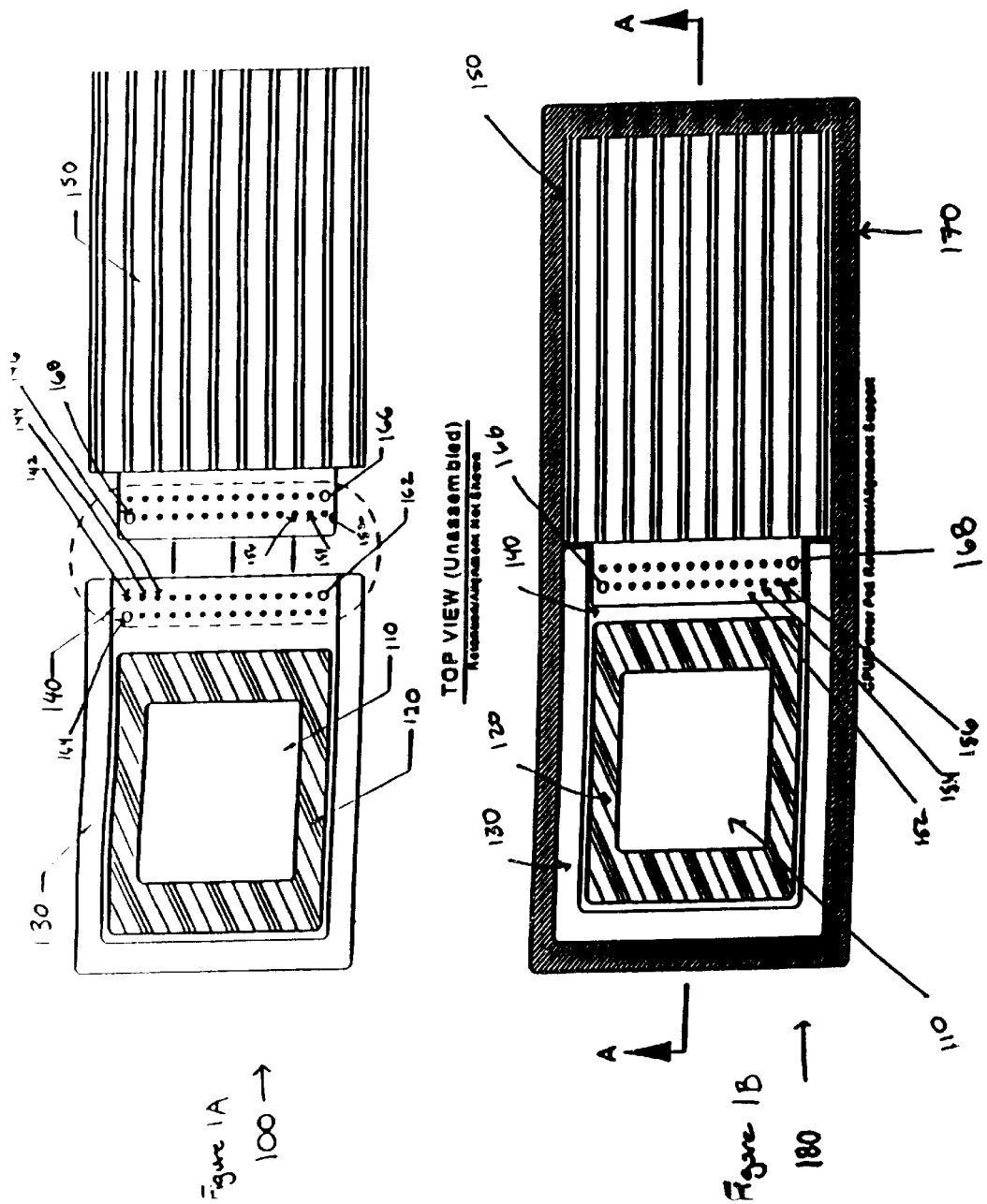
FIG. 1A is a top view of an unassembled LGA integrated circuit device package and a DC—DC converter according to one embodiment of the present invention.
FIG. 1B is a top view of an assembled LGA integrated circuit device package and a DC—DC converter according to one embodiment of the present invention.

Referring now to FIG. 1A, there is shown a top view of an unassembled LGA integrated circuit device package and a DC—DC converter 100 in accordance with an embodiment of the present invention. An integrated circuit device 110 (i.e., a silicon chip) may be mounted to an LGA package 120 in a manner well known in the art of microelectronic fabrication. The LGA package 120 comprises a substrate which may be fabricated of laminates such as FR-4, fiberglass or bismaleimide-triazine (BT) material, of coated aluminum, ceramic, or other suitable materials and multiple conductive layers which are laminated or co-fired between the varied dielectric layers. The integrated circuit device 110 may be an analog device, a microprocessor, an application specific device, or any other type of integrated circuit device and may be electrically connected to an array of terminals (i.e., typically circular or rectangular pads) (not shown in this view) on the LGA package 120. The pads on the LGA package 120 correspond to a pattern of a contact array (not shown in this view) on an LGA socket 130 when properly aligned with the socket 130.

The socket itself 130 is sandwiched between the LGA package 120 and the motherboard (not shown in this view). The socket 130 comprises a substrate formed of non-conductive material to receive the LGA package 120. The contacts on the socket 130 may be fabricated of a conductive material and extend transversely through the substrate from a top surface of the substrate to a bottom surface of the substrate. The contacts function to electrically couple the socket 130 and the LGA package 120 to the underlying motherboard on which the socket 130 is mounted. The socket 130 may be mated to the motherboard by a force applied downwardly on the socket 130 which then compresses the conductive elements to effect a reliable electrical contact between the socket 130 and its respective contact pads and the motherboard and its respective contact pads. In order to maintain alignment between the pads, a retention mechanism such as a frame element (now shown in this view) may be provided around the socket 130. In addition, a spring clip extending across the body of the frame element or any other suitable clamping mechanism may be used to hold the socket 130 down against the pads on the motherboard. Of course, it should be noted that the socket 130 may also be soldered down (surface mounted) to the motherboard using conventional reflow soldering methods or mounted to the motherboard using a variety of other techniques well known in the art.

An LGA power socket interface 140 comprising an array of contact pads 142, 144, 146, etc., existing on one side of the power socket interface 140 function to connect the power socket interface 140 to the DC—DC converter 150. The power socket interface 140 may be part of the socket 130 or, alternatively, may exist as a separate contact arrangement (not shown in this view). The contact pads 142, 144, 146, etc., may be fabricated from metal, conductive polymer, or any other suitable material. The contact pads 142, 144, 146, etc., on the power socket interface 140 correspond to an array of contact pads 152, 154, 156, etc., existing on the DC—DC converter 150. The number and arrangement of the power contact pads 142, 144, 146, 152, 154, 156, etc., is such that the resistance and inductance of the interconnect is minimized. The patterns to minimize inductance are well known to those skilled in the art of the fabrication of microelectronic packages. The two devices may thus be mated together using compression contact technology in the same manner as is previously described. Alignment apertures 162 and 164 on the power socket interface 140 and alignment apertures 166 and 168 on the DC—DC converter 150 help ensure proper alignment between the power socket interface 140 and the DC—DC converter 150 (i.e., when the two devices are compression mounted alignment pins (not shown in this view) are inserted into the alignment apertures 162, 164, 166, and 168 to help align the devices). Although alignment pins are described in the present embodiment, other forms of fastening mechanisms are also possible such as spring clips and the like.

The DC—DC converter 150 connects to a power supply (not shown in this view) that supplies power at a higher voltage (e.g., 12 or 48 volts and ground) than is typically required by the integrated circuit device 110. The DC—DC converter 150 includes conventional voltage conversion circuits within a housing to convert the higher voltage to a lower voltage and to supply the lower voltage to the power socket interface 140 and subsequently to the motherboard in a manner well known in the art. A heat sink comprised of thermally conductive materials (e.g., copper, aluminum, titanium, etc.) may form the outer casing of the DC—DC converter 150 so that heat generated by the conversion circuits can dissipate by convection directly into the surrounding air in a manner well known in the art. It should be noted that by configuring the DC—DC converter 150 in the manner described by the present embodiment, benefits are provided to the manufacturer in that the DC—DC converter 150 may be separately tested before mating the DC—DC converter 150 to the power socket interface 140.

Referring now to FIG. 1B, there is shown a top view of an assembled LGA integrated circuit device package and a DC—DC converter 180 in accordance with an embodiment of the present invention. The array of contacts 152, 154, and 156, etc., on the DC—DC converter 150 and an array of contacts (not shown in this view) on a power socket interface 140 are compression mounted together. Alignment pins (not shown in this view) inserted through alignment apertures 166 and 168 in the DC—DC converter 150 and alignment apertures (not shown in this view) in the power socket interface 140 assist in the proper alignment between the two devices. A retention mechanism 170 performs an additional alignment function and maintains the DC—DC converter 150 in secure electrical contact with the power socket interface 140. The retention mechanism 170 may be fabricated from plastic, aluminum, or any other suitable materials. In the present embodiment, the retention mechanism 170 comprises a frame element rectangular in shape that may be secured with nuts and bolts to the motherboard (not shown in this view), although other fastening techniques well known in the art may also be uses. An LGA socket 130 including an LGA package 120 (which includes an integrated circuit device 110) mounted to the socket 130 in a manner well known in the art of microelectronic fabrication may be mated to the motherboard through a relief (not shown in this view) in the retention mechanism 170. It should be understood, however, that although the retention mechanism 170 is illustrated in the embodiment illustrated by FIG. 1B, it is also possible to use the socket 130 itself as a retention mechanism or to use other similar retention mechanisms known in the art.

Figure 2:
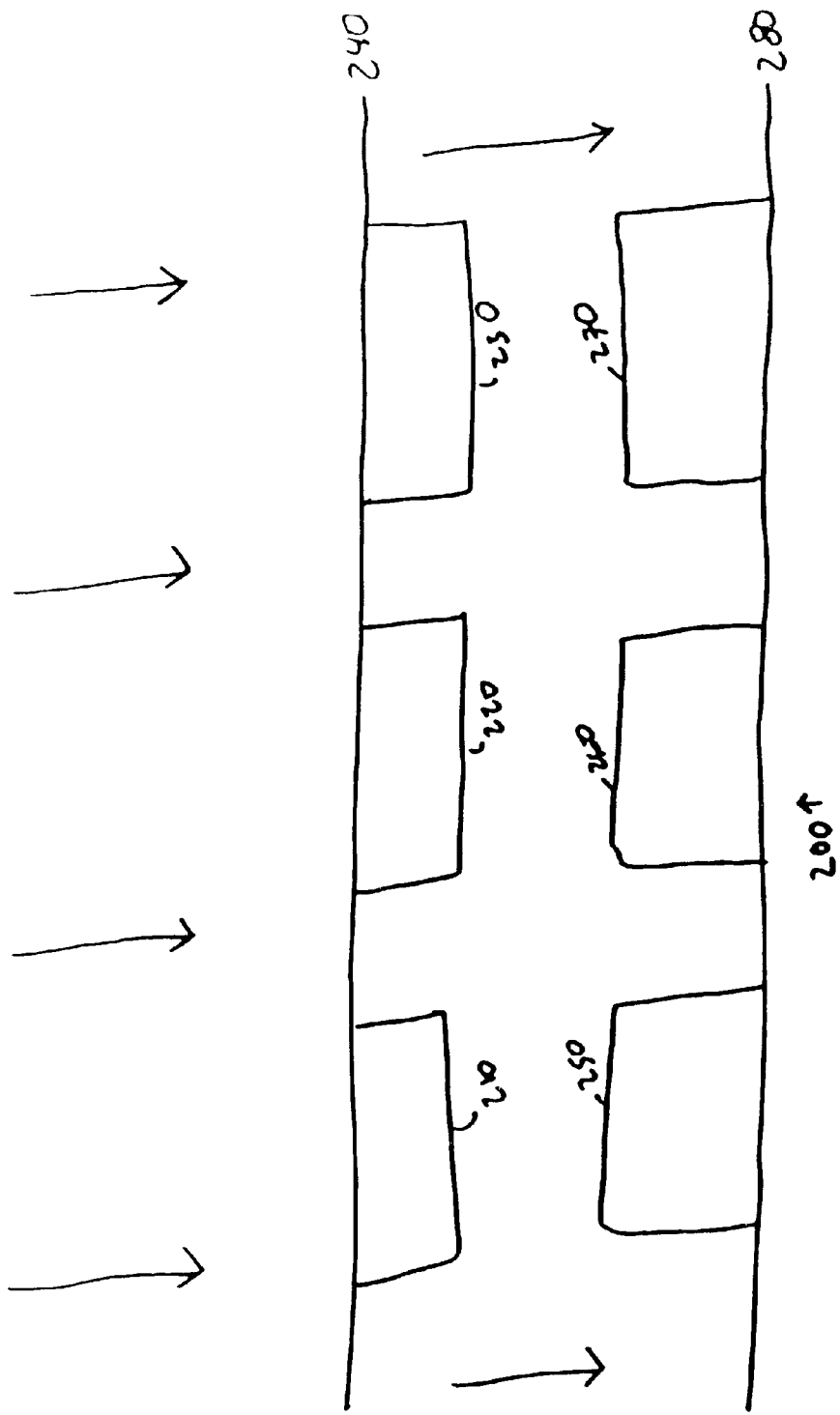
FIG. 2 is an exploded view of a cross section of the contact details of a DC—DC converter as it is being mounted to a power socket interface according to one embodiment of the present invention.

Referring now to FIG. 2, there is shown an exploded view of a cross section of the contact details of a DC—DC converter mounted to a power socket interface 200 in accordance with an embodiment of the present invention. An array of contacts 210, 220, and 230 on the DC—DC converter 240 are compression mounted to an array of contacts 250, 260, and 270 on the power socket interface 280. The DC—DC converter 240 is pressed downward from a vertical direction on to the power socket interface 280, thus providing for a single direction of assembly.

Figure 3:
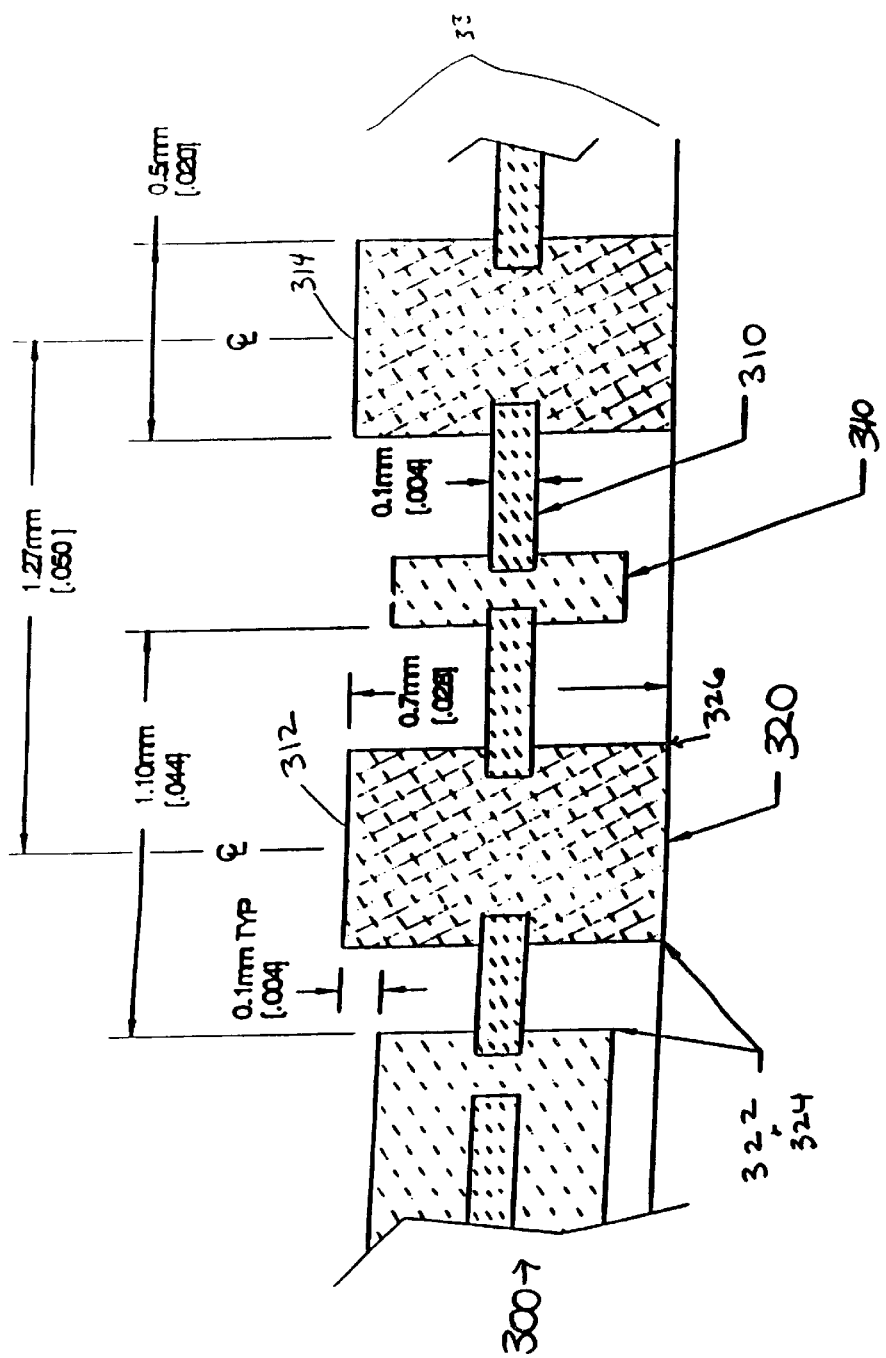
FIG. 3 is an exploded view of a cross-section of the contact details of an LGA socket mounted to a motherboard according to one embodiment of the present invention.

Referring now to FIG. 3, there is shown an exploded view of a cross section of the contact details of an LGA socket mounted to a motherboard 300 in accordance with an embodiment of the present invention. The socket base 310 includes an array of contacts 312 and 314, etc., formed to receive corresponding land pads of an LGA package (not shown in this view). The contacts 312 and 314, etc., may be formed of a conductive material (e.g., conductive polymer, metal, or others) and extend from a top surface of the socket base 310 to a bottom surface of the socket base 310 and provide electrical coupling of an integrated circuit device (not shown in this view) to a motherboard 320. Coax structures 322, 324, 326, etc., for high signal integrity may be metalizations of the socket 330 and provide a stop for the socket 330 as it is compressed downward from a vertical direction on to the motherboard 320 so that the contacts 312 and 314, etc., compress to a predetermined level but will not continue to compress further. Copper bar 340 (and multiple other copper bars (not shown in this view)) coupled to the socket base 310 may be used for EMI shielding and/or ground for the integrated circuit device I/0 structure. In the embodiment illustrated by FIG. 3, the copper bar 340 and the multiple other copper bars are relatively wide and thick (i.e., six ounces), but copper bars of other dimensions may also be used.

Referring now to FIG. 4A, there is shown a cross-sectional view of the spatial relationship of the component parts of an unassembled LGA integrated circuit device package and a DC—DC converter 400 in accordance with an embodiment of the present invention. An integrated circuit device 410 may be connected to an LGA package 420 using an array of terminals (i.e., land pads) 422, 424, 426, etc., in a manner described in the embodiment illustrated by FIG. 1A. An array of contacts (not shown in this view) on an LGA socket 430 correspond to the land pads 422, 424, 426, etc., on the LGA package 420. The contacts on the socket 430 may be fabricated from conductive polymer or other suitable material and are coupled to the socket base 440. The contacts comprise compressive contacts to receive electrical signals from the integrated circuit device 410 and compressive contacts 432, 434, 436, and 438, etc., to receive power from a DC—DC converter 450.

The DC—DC converter 450 comprises a substrate 452 which may be fabricated of laminates such as FR-4, fiberglass, coated aluminum, or any other suitable material, an output voltage plane (i.e., a VCC voltage plane) 454 to provide output voltage to the socket 430, and a ground plane (GND) 456 to complete the circuit path in a manner well known in the art of power delivery systems. A GND plane 442 may also be included in the socket base 440. The LGA integrated circuit device package and DC—DC converter may be assembled (not shown in this view) and mounted to a motherboard 460 using conventional fastening techniques in a manner described in the embodiment illustrated by FIG. 1A. A LGA power socket interface 470 may be mounted to the DC—DC converter 450 in a manner also previously described in the embodiment illustrated by FIG. 1A.

Referring now to FIG. 4B, there is shown a cross-sectional view of the spatial relationship of the component parts of an assembled LGA integrated circuit device package and a DC—DC converter 490 in accordance with an embodiment of the present invention. The component parts of FIG. 4B are identical to the component parts of FIG. 4A and thus retain the same numeric designations.

Thus, a structure and process for delivering high current low voltage DC power from a DC—DC converter to an LGA socket and corresponding microelectronic packages without passing that current through the underlying motherboard has been described. Although the foregoing description and accompanying figures discuss and illustrate specific embodiments, it should be appreciated that the present invention is to be measured only in terms of the claims that follow.

What is claimed is:

1. A method of mounting a land grid array socket to a power converter, the method comprising:
   providing an array of contacts on a surface of the power converter;
   providing an array of contacts on a land grid array socket interface corresponding to the array of contacts on the power converter;
   mounting the land grid array socket to the power converter by vertically compressing the array of contacts on the land grid array socket interface to the array of contacts on the surface of the power converter.

2. The method of claim 1 wherein the step of mounting the land grid array socket to the power converter provides an electrical connection between the land grid array socket and the power converter.

3. The method of claim 1 wherein the land grid array socket includes an integrated circuit device mounted to a land grid array package.

4. The method of claim 1 wherein the step of mounting the land grid array socket to the power converter further comprises the step of mounting the land grid array socket to a printed circuit board by vertically compressing an array of contacts on the land grid array socket with an array of corresponding contacts on the printed circuit board.

5. The method of claim 4 wherein the step of mounting the land grid array socket to the printed circuit board provides an electrical connection between the land grid array socket and the printed circuit board.

6. The method of claim 1 wherein the step of mounting the land grid array socket to the printed circuit board further comprises the step of mounting the land grid array socket to a retention mechanism, the array of contacts on the land grid array socket mounted to the array of contacts on the printed circuit board through a relief in the retention mechanism.

7. The method of claim 1 wherein the land grid array socket serves as a retention mechanism to hold the land grid array socket in proper alignment with the printed circuit board and in proper alignment with the power converter.

8. The method of claim 1 wherein the power converter converts voltage received from a power supply to a lower voltage and transmits the lower voltage to the land grid array socket.

* * * * *